United States Patent
Almogy et al.

(10) Patent No.: US 6,946,655 B2
(45) Date of Patent: Sep. 20, 2005

(54) SPOT GRID ARRAY ELECTRON IMAGING SYSTEM

(75) Inventors: Gilad Almogy, Givataim (IL); Oren Reches, Zoran (IL)

(73) Assignee: Applied Materials, Inc., Santa Clara, CA (US)

( * ) Notice: Subject to any disclaimer, the term of this patent is extended or adjusted under 35 U.S.C. 154(b) by 383 days.

(21) Appl. No.: 09/986,137

(22) Filed: Nov. 7, 2001

(65) Prior Publication Data

US 2003/0085353 A1 May 8, 2003

(51) Int. Cl.$^7$ .................................................. H01J 37/28
(52) U.S. Cl. ...................................................... 250/310
(58) Field of Search .......................................... 250/310

(56) References Cited

U.S. PATENT DOCUMENTS

| | | |
|---|---|---|
| 3,894,332 A | 7/1975 | Nathanson et al. |
| 3,963,354 A | 6/1976 | Feldman et al. |

(Continued)

FOREIGN PATENT DOCUMENTS

| | | |
|---|---|---|
| EP | 0299432 A2 | 1/1989 |
| EP | 0647828 A2 | 4/1995 |
| EP | 0679864 A1 | 11/1995 |
| EP | 0871052 A1 | 10/1998 |
| EP | 0948027 A2 | 10/1999 |
| EP | 1058111 A2 | 12/2000 |
| EP | 1138254 A1 | 10/2001 |
| GB | 2339960 A | 2/2000 |
| JP | 01263541 | 10/1969 |
| JP | 2000066374 | 3/2000 |
| WO | WO 97/34171 | 9/1997 |
| WO | WO 98/57151 | 12/1998 |
| WO | WO 99/48041 | 9/1999 |
| WO | WO 01/09920 A1 | 2/2001 |
| WO | WO 01/84585 A1 | 11/2001 |
| WO | WO 02/15223 A1 | 2/2002 |
| WO | WO 02/23172 A2 | 3/2002 |
| WO | WO 02/23590 A1 | 3/2002 |

OTHER PUBLICATIONS

International Search Report dated Aug. 4, 2003.
"High throughput electron lithography with the multiple aperture pixel by pixel enhancement of resolution concept", Kruit, P., J. Vac. Sci. Technol. B 16(6), Nov./Dec. 1998.

(Continued)

Primary Examiner—John R. Lee
Assistant Examiner—Phillip A Johnston
(74) Attorney, Agent, or Firm—McDermott, Will & Emery (57) ABSTRACT

A high data-rate electron beam spot-grid array imaging system is provided that overcomes the low resolution and severe linearity requirements of prior art systems. Embodiments include an imaging system comprising an electron beam generator for simultaneously irradiating an array of spots spaced apart from each other on a surface of an object to be imaged, and a detector for collecting backscattered and/or secondary electrons emitted as a result of the interaction of the spots with the surface of the object to form an image of the irradiated portions of the object surface. A mechanical system moves the substrate in a direction which is nearly parallel to an axis of the array of spots such that as the substrate is moved across the spot array in the scan direction (the y-direction) the spots trace a path which leaves no gaps in the mechanical cross-scan direction (the x-direction). A compensator, such as a servo or a movable mirror, compensates for mechanical inaccuracies in the moving stage, thereby increasing imaging accuracy. In other embodiments, multiple detectors placed at different angles to the substrate collect electrons to provide multiple perspective imaging of the substrate surface.

42 Claims, 8 Drawing Sheets

U.S. PATENT DOCUMENTS

| | | | |
|---|---|---|---|
| 4,500,202 A | | 2/1985 | Smyth |
| 5,090,803 A | | 2/1992 | Ames et al. |
| 5,196,900 A | | 3/1993 | Pettersen |
| 5,239,178 A | | 8/1993 | Derndinger et al. |
| 5,248,876 A | | 9/1993 | Kerstens et al. |
| 5,659,420 A | | 8/1997 | Wakai et al. |
| 5,737,084 A | | 4/1998 | Ishihara |
| 5,783,833 A | | 7/1998 | Sugaya et al. |
| 5,889,593 A | | 3/1999 | Bareket |
| 5,900,637 A | | 5/1999 | Smith |
| 5,932,966 A | | 8/1999 | Schneider et al. |
| 6,014,200 A | * | 1/2000 | Sogard et al. ............ 355/53 |
| 6,040,909 A | | 3/2000 | Hasegawa et al. |
| 6,043,932 A | | 3/2000 | Kusunose |
| 6,108,090 A | | 8/2000 | Ishihara |
| 6,130,428 A | | 10/2000 | Pasch |
| 6,133,986 A | | 10/2000 | Johnson |
| 6,208,411 B1 | | 3/2001 | Vaez-Iravani |
| 6,208,413 B1 | | 3/2001 | Diehl et al. |
| 6,248,988 B1 | | 6/2001 | Krantz |
| 2002/0033449 A1 | * | 3/2002 | Mamoru et al. ......... 250/306 |
| 2003/0042434 A1 | | 3/2003 | Mankos et al. |

OTHER PUBLICATIONS

"Microlens arrays with spatial variation of the optical functions", Hessler, Tn., et al., Pure Appt. Opt. 6(1997) 673–681.

"A Microlens Direct–Write Concept for Lithography", Davidson, M., SPIE 3048, p. 346–355.

"Immersion lithography at 157 nm", Swilkes, M. et al., J. Vac. Sci. Technol. B, vol. 19, No. 6, Nov./Dec. 2001, pp. 2353–2356.

"Liquid immersion deep–ultraviolet interferometric lithography", Hoffnagle, J. et al., Vac. Sci. Technol. B 17 6), Nov./Dec. 1999, pp. 3306–3309.

"An Overview of the Performance Envelope of Digital Micromirror Device (DMD) Based Projection Display Systems", Sampeall, J. B., Society for Information Display 1994 Internatinal Symposium (San Jose, Jun. 12–17, 1994), pp. 1–4.

"UV Thermoresists: Sub 100nm Imaging Without Proximity Effects", Gelbart, D. et al., SPIE vol. 3676, pp. 786–793.

"Projection X–Ray Lithography Using Arrays of Zone Plates", M. Feldman, Electrical & Computer Engineering Department, pp. 136–144.

"Zone–plate–array lithography in the deep ultraviolet", Ihsan J. Djomehri et al., American Vacuum Society, 1998, pp. 3426–3429.

"Zone–Plate Array Lithography (ZPAL): A new maskless approach", D.J.D. Carter et al., Part of the SPIE Conference on Emerging Lithographic Technologies III, Mar. 1999. pp. 324–332.

"Use of Zone Plate Arrays in Projection X–Ray Lithography", M. Feldman, Electrical and Computer Engineering Department, Louisana State University, 1993, pp. 207–207.

"A proposal for maskless, zone–plate–array nanolithography", Henry I. Smith, American Vacuum Society, 1996, pp. 4318–4322.

"Maskless, parallel patterning with zone–plate array lithography", D.J.D. Carter et al., American Vacuum Society, 1999, pp. 3449–3452.

"Confocal principle for macro–and microscopic surface and defect analysis", Hans J. Tiziani et al., Society of Photo–Optical Instrumentation Engineers, 2000, pp. 32–39.

"Lithographic patterning and confocal imaging with zone plates", Dario Gil et al., American Vacuum Society, 2000, pp. 2881–2885.

"Theoretical analysis of confocal microscopy with microlenses", H.J. Tiziani et al., Applied Optics, vol. 35, No. 1, Jan. 1, 1996, pp. 120–125.

"Quality control and process observation for the micro assembly process". . . Tilo Pfeifer et al, Measurement, Institute of Measurement and Control: vol. 30, No. 1, Jul. 2001, pp. 1–18.

Partial International Search Report dated May 5, 2003.

* cited by examiner

SPOT GRID ARRAY ELECTRON IMAGING SYSTEM

RELATED APPLICATIONS

The present application is related to Applicants' application Ser. No. 09/986,138, entitled SPOT GRID ARRAY IMAGING SYSTEM, filed Nov. 7, 2001, entitled SPOT GRID ARRAY IMAGING SYSTEM, which matured into U.S. Pat. No. 6,639,201, issued Oct. 28, 2003.

FIELD OF THE INVENTION

The present invention relates to an electron beam imaging system. The present invention has particular applicability in imaging systems optimized for automated defect inspection.

BACKGROUND ART

Automated inspection is a technique for measuring the integrity of an object by collecting an image of it and comparing that image to a reference (e.g., comparing a die to a data-base for photolithographic masks), to another part of that object (such as die-to-die inspection for semiconductor wafers), or to a reference image (die-to-"golden image"). Disadvantageously, when conducting high-resolution inspection of large semiconductor substrates, the FOV of the imaging system cannot cover the entire substrate to be inspected, so the substrate must be moved or "stepped" across the FOV, thereby increasing inspection time. To increase throughput, some conventional automated inspection tools continuously scan the substrate in one direction while optically imaging an orthogonal one-dimensional optical FOV. Once the substrate is traversed in the scanning direction, it is typically moved in the other (cross-scan) direction by a distance of one FOV, and then its path is retraced, creating a serpentine motion path.

Other optical imaging systems for inspecting semiconductor substrates utilize a "spot grid array" to achieve high throughput. In these systems, an imager typically includes a two-dimensional and periodic array of lenses, each lens imaging a spot in an object plane, such as a substrate to be inspected, upon an image plane to image a two-dimensional and periodic array of spots from the object plane upon the image plane. A sensor, such as a CCD, is provided in a conjugate image plane with a two-dimensional and periodic array of readout elements, each collecting the signal from a spot in the object plane. A mechanical system moves the substrate such that as the substrate is moved across the spot array in the scan direction (the y-direction) the spots trace a path which leaves no gaps in the mechanical cross-scan direction (the x-direction). Thus, imaging of very large FOVs is accomplished by employing an array of optical elements each having a minimal FOV, rather than complex large-FOV optics. Optical imaging devices utilizing a spot grid array are described in U.S. Pat. No. 6,248,988 to Krantz, U.S. Pat. No. 6,133,986 to Johnson, U.S. Pat. No. 5,659,420 to Wakai, and U.S. Pat. No. 6,043,932 to Kusnose.

These and other previous implementations of spot-grid array concepts suffer from several limitations. To achieve the very high data-rates required for high-end inspection with all-mechanical stage scanning, a large array is required. However, some major problems prevent the use of prior art technologies for large arrays, such as relatively limited focus capabilities, imaging linearity, dielectric layer interference, and limited fault detection and classification capabilities. Each of these problems will now be discussed in turn.

One limitation of prior art optical spot grid array implementations arises from the fact that inspecting with confocal imaging requires very tight focus control, which is very difficult to achieve at high scan rates with large numerical aperture short-wavelength optics. To overcome this problem, simultaneous multi-height confocal imaging is necessary. However, while taking several height-slice images sequentially, as described in the prior art, is compatible with a one frame review mode, it is not compatible with the continuous motion requirements of inspection systems.

Another limitation to large arrays in the prior art is the linearity requirement on the lens array, imaging optics and detector arrays. To obtain good results from a spot grid array system, close tolerances on the linearity of the optics is important—both for the microlens array and for the de-magnification optical elements. The optical spots must be located on an exactly rectilinear grid with very exact distances between the spots. Such extreme linearity is difficult and expensive to achieve.

Another limitation of prior art technology is the need to employ a coherent laser source to achieve sufficient power density for high-speed inspection. Many inspected substrates are covered by transparent or semitransparent dielectric layers, which cause interference phenomena between the surfaces of the dielectric layers. As the thickness of these layers varies across the wafer, the phase of the reflections of the coherent light from the top and bottom of the dielectric layer varies. Moreover, the interference can be either constructive or destructive. These interference phenomena cause a change in the reflected power despite the absence of defects or irregularities, limiting the accuracy of defect detection and thereby limiting the capability of the system to identify true defects.

A further limitation of prior art spot grid array techniques arises from the limited fault detection and classification ability resulting from the collection of light signals from a single angular section of an object. As a result, fault detection and analysis may require more than a single inspection, thus dramatically increasing the amount of data that needs to be processed and collected for reliable detection and classification of faults.

There exists a need for a low-cost, accurate, high-speed imaging system with a large FOV for reducing manufacturing costs and increasing production throughput.

SUMMARY OF THE INVENTION

The present invention provides an electron beam spot grid array imaging system instead of an optical imaging system, thus enhancing resolution and allowing for an analysis of the conductivity and resistance of the object.

The present invention further provides a high data rate electron beam spot grid array imaging system having a small overlap between coverage areas of spots of a spot array in consecutive columns, thereby overcoming the severe linearity requirements of prior art systems.

The present invention further provides for the collection of emitted electrons from the spots formed on the substrate from several directions simultaneously, thereby improving the fault classification and detection capabilities of the imaging system.

Other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other features are achieved in part by an imager comprising an electron beam generator for simultaneously irradiating an array of spots spaced apart from each other on a surface of an object to be imaged, and a detector for collecting signals resulting from the interaction of the spots with the surface of the object to form an image of the irradiated portions of the object surface. A mechanical system moves the substrate in a direction nearly parallel to an axis of the array of spots such that as the substrate is moved across the spot array in the scan direction, the spots trace a path which leaves no gaps in the mechanical cross-scan direction.

Additional features of the present invention will become readily apparent to those skilled in the art from the following detailed description, wherein only the preferred embodiments of the present invention are shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

An embodiment of the present invention will now be described with reference to FIG. 1a. An electron source 100 or 100a generates an ordered array of electron beams (also called "e-beams") 110 or 110a to irradiate a substrate 160 to create a spot array 150 on the surface of substrate 160. The spot array on the substrate 160 can be generated either by employing an electron-optical system for imaging and beam separation (e.g., a projection apparatus comprising electron source 100 and a beam splitter 120), or by side illumination using electron source 100a. Detector 130 collects secondary electrons (SE) or backscattered electrons (BE) from substrate 160, and imager 140, which is analogous to conventional systems used in low-electron energy microscopy (LEEM) techniques, provides an SE or BE image of substrate 160.

Substrate 160 is carried on a mechanical stage 165 which is moved in the y direction in a direction which is nearly parallel to one of the axes y of the array of spots 150. The deviation from parallelicity is such that as substrate 160 is moved a distance substantially equal to the length L of the spot array in the scan direction y, the spots trace a path which leaves no gaps in the mechanical cross-scan direction (the x direction), thereby ensuring that the entire surface of substrate 160 is irradiated.

Electron source 100, 100a can employ well-known techniques such as multiple cathodes within an electron imaging column, each cathode producing an e-beam 110, 110a. Alternatively, as shown in FIG. 1b, a membrane 101 having an array of pin-holes 102 corresponding to e-beams 110, 110a can be provided to block an area flux of electrons 103 produced by an area flux electron source 104, resulting in only e-beams 110, 110a reaching substrate 160.

Figure 1A:
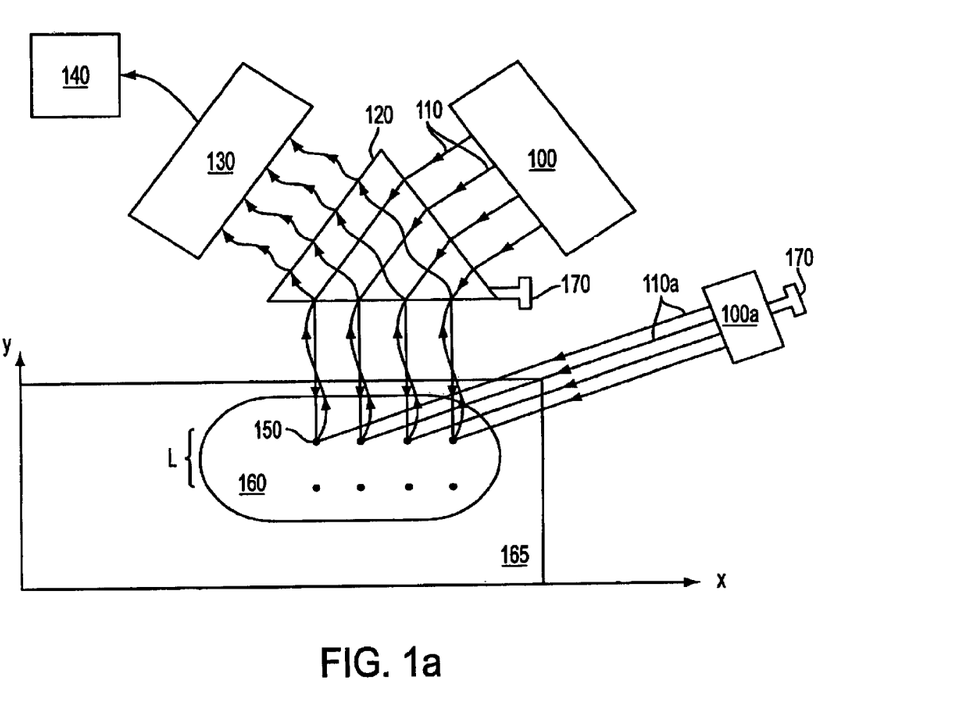
FIGS. 1a–1e schematically illustrate imaging systems in accordance with embodiments of the present invention.
Figure 1B:
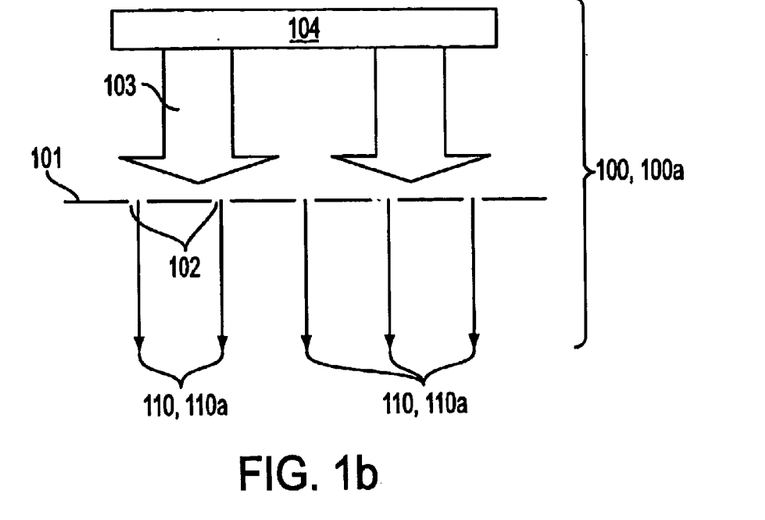
Figure 1C:
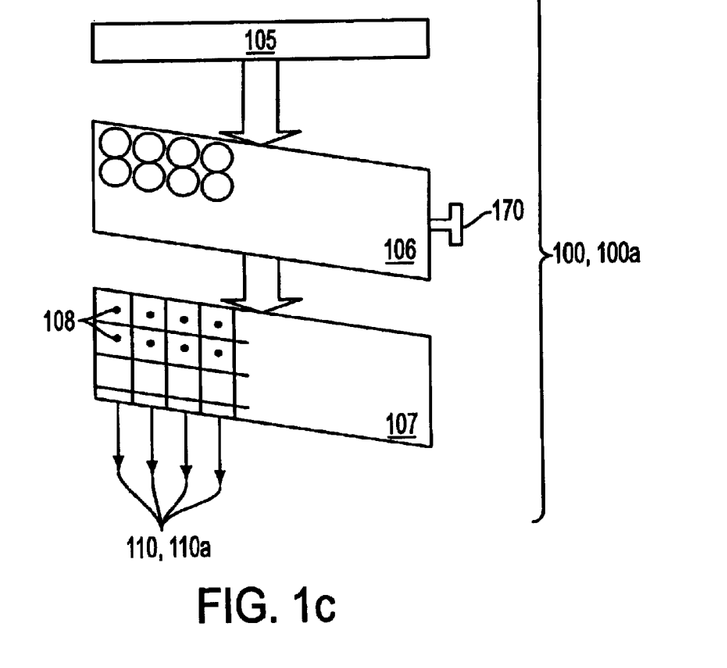

In another embodiment of the present invention, as illustrated in FIG. 1c, a conventional photocathode 107 is illuminated with an array of optical spots 108 (corresponding to e-beams 110, 110a) generated by a light source 105 and focused with a microlens array 106. Photocathode 107 generates e-beams 110, 110a in response to optical spots 108. Microlens array 106 can be a single array of lenses, or multiple arrays arranged in series, as per coventional optical techniques, so the optical paths of the individual lens elements from the separate arrays form a compound lens. Such an arrangement results in arrays of compound lenses having a higher numerical aperture than can be obtained with arrays of single lenses. Such compound micro-lens arrays can be mechanically assembled by stacking individual lens arrays, or manufactured by, for example, well-known MEMS (microelectro mechanical systems) manufacturing techniques.

Figure 1D:
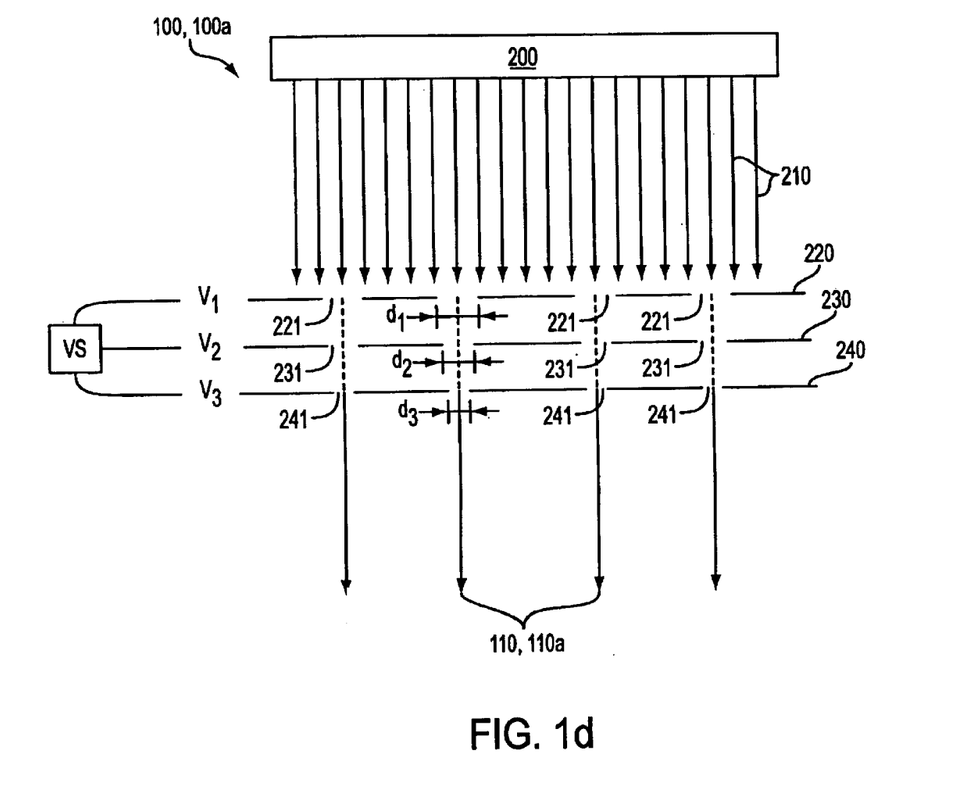

In a further embodiment of the present invention, illustrated in FIG. 1d, electron source 100, 100a comprises a collimated electron source 200 for generating a wide collimated electron beam 210 and a plurality of electron-blocking masks 220–240 to act as the equivalent of optical microlenses for converting wide collimated beam 210 into an array of focused e-beams 110, 110a for forming spot array 150 on substrate 160. Each mask 220–240 is a metallic planar membrane having an array of pinholes 221, 231, 241 corresponding to each e-beam 110, 110a. Masks 220–240 are substantially parallel to each other and aligned such that their pinholes 221, 231, 241 are concentric. Each mask 220–240 has pinholes of a different diameter than the other masks. Thus, the diameter $d_1$ of pinholes 221 is different from the diameter $d_2$ of pinholes 231, which is different than the diameter $d_3$ of pinholes 241. Each mask 220–240 is connected to a conventional voltage source VS for holding each of them at a different voltage $V_1$–$V_3$, thereby creating a microlens array for electrons.

Figure 1E:
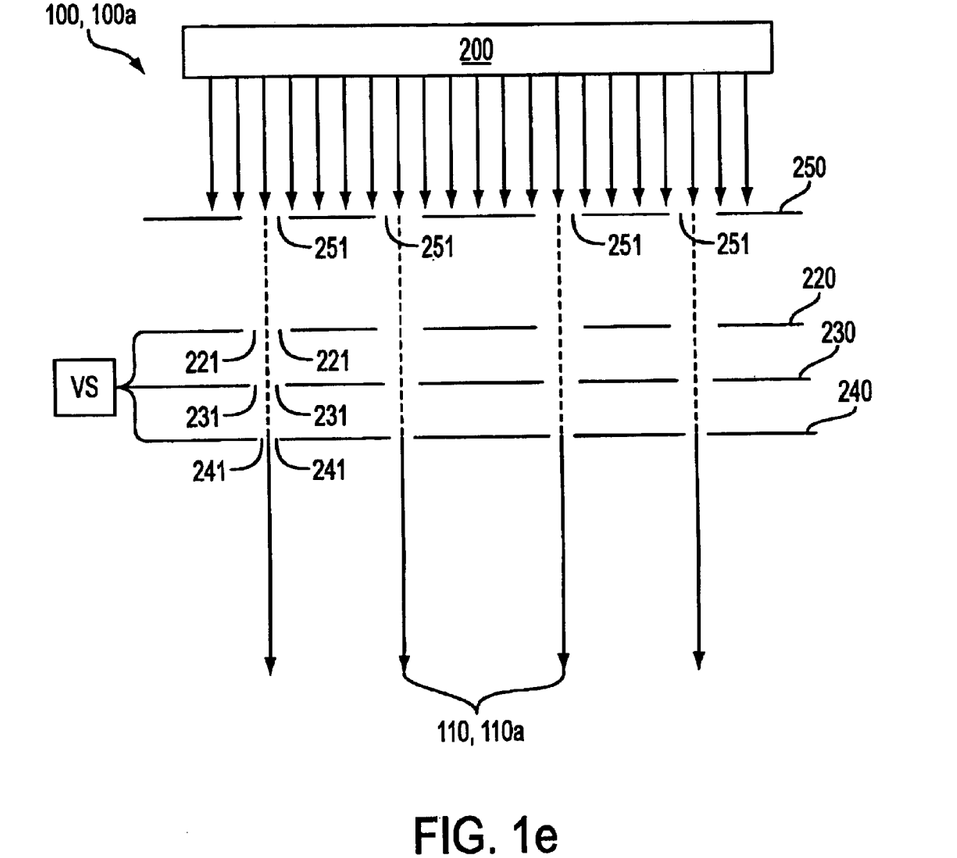

As the performance of electron optics is limited for off-axis electron beams, in a further embodiment of the present invention, an aperture membrane 250 having pinholes 251 corresponding to pinholes 221, 231, 241 in masks 220–240 is placed between collimated electron source 200 and masks 220–240 (see FIG. 1e). Aperture membrane 250 thus serves as an array of apertures for the individual "lenses" of the electron microlens array.

The collected electrons (back-scattered or secondary) can be collected by detector 130 using LEEM techniques. In one embodiment of the present invntion, the electron imaging system composed of electron source 100, 100a and beam splitter 120 is used to image an area of substrate 160 upon a two-dimensional electron detector array (such as a conventional multi-channel plate (MCP) coupled to a detector array such as a CCD, or a scintillator coupled to an image intensifier and CCD, all of which are part of detector 130. In standard LEEM, there is a severe challenge of obtaining a fine resolution in a large FOV. However, when generating discrete spots as in the technique of the present invention, the LEEM resolution only has to be sufficient to prevent cross-talk between the spots. Furthermore, high-speed e-beam inspection can be limited by thermal and radiation damage effects created by the large electron current needed to collect the sufficient signal for the high-data rate imaging. However, the use of a very large number (on the order of $10^6$) of parallel sources allows a dramatically lower data rate for each source (100's of Hz to several KHz Vs. 10's of MHz) and therefore use of a much smaller current (on the pico-amps scale vs. tens of nanoamps).

Figure 2:
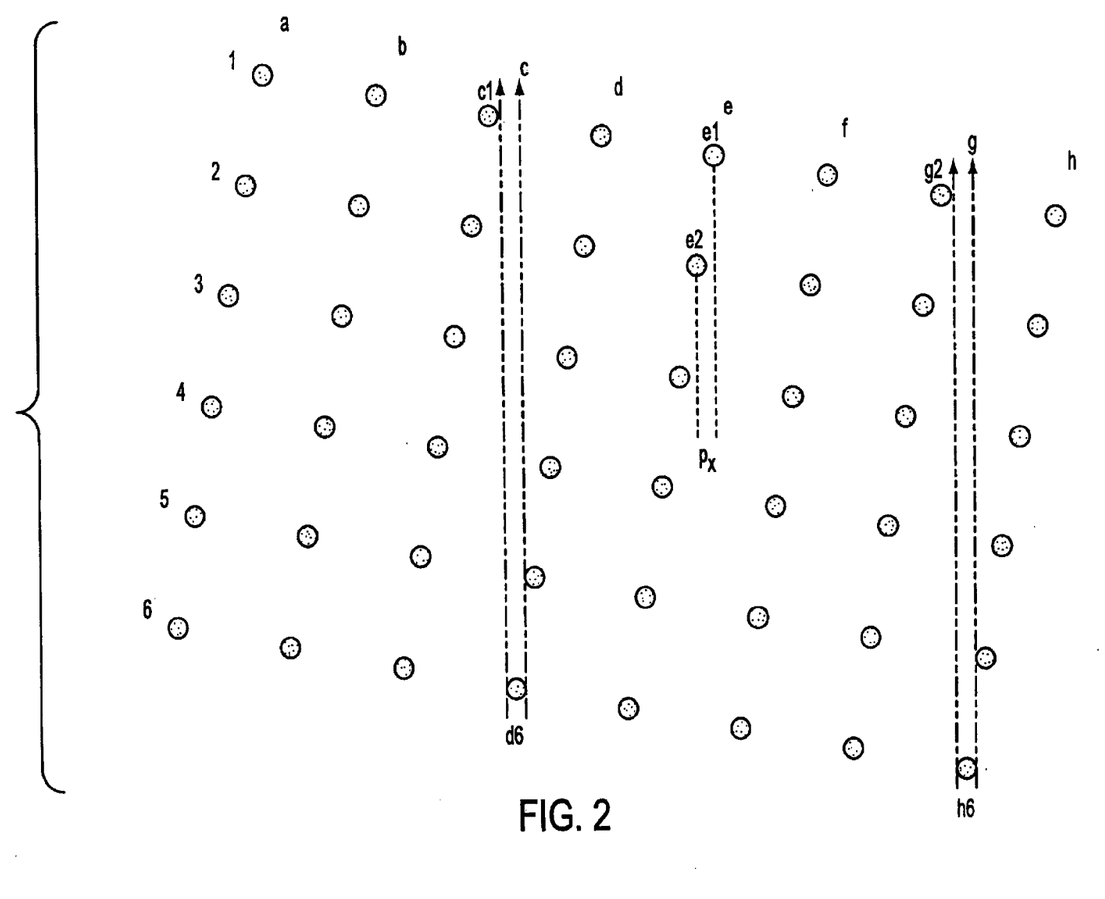
FIG. 2 depicts a spot array on the surface of the object plane produced by the systems of FIGS. 1a–1e.

FIG. 2 schematically depicts spot array 150 in the substrate (object) plane. For simplicity, FIG. 2 shows an 8 wide (a–h) by 6 deep (1–6) array of spots. When practicing the present invention, the array typically comprises at least several hundred e-beams, resulting in a corresponding number of spots. The shift in the mechanical cross-scan x direction between the centers of spots in consecutive lines determines the pixel size in the x direction (i.e., the projection $p_x$ on the x-axis of the distance between the e'th spot in the first line e1 and the e'th spot in the 2nd line e2). The pixel size reflects how densely substrate 160 is sampled. To obtain continuous coverage of substrate 160, the last spot in column d6 must trace a path no more than one pixel away in the cross-scan x direction from the tangent of the first spot in an adjacent column (c1). The pixel size in the mechanical scan y direction $p_y$ (not shown) is determined by the distance traversed between the spot center of a given spot between two consecutive samplings of detector 130; that is, the distance between the center of a spot f4 at time 0 ("f4t0") and the same spot one sampling interval later ("f4t1"). This distance is determined by multiplying the stage velocity and sampling interval.

Substrate motion via stage 165 can be achieved by any means ensuring accurate and linear motion, such as can be obtained from a conventional interferometer-controlled stage with linear motors and air-bearings, commercially available from Anorad Corporation of New York. To correct the residual inaccuracy such as that created by mechanical vibrations of stage 165, a servo 170 can be included to control an element for moving the spot array and compensating for the substrate mislocation. In the embodiment of FIG. 1a, the movable element may be the beam splitter 120. In another embodiment of the present invention, the movable element is the electron source 100a itself. In the embodiment of FIG. 1c, the movable element can be microlens array 106. The angle of incidence upon the back pupil of lens array 106 may be changed by means of a movable mirror, an electro-optic or an acoustooptic element in the optical illumination path.

In the embodiment of FIGS. 1a and 2, the shift in the mechanical cross-scan x direction between the centers of spots in consecutive lines determines the pixel size in the x direction (e.g. the projection $p_x$ on the x-axis of the distance between the e'th spot in the first line e1 and the e'th spot in the 2nd line e2). Moreover, the last spot in one column (d6) passes a distance of one cross-scan pixel ($p_x$) away from the path of the first spot of an adjacent column (c1). Therefore, the distance between the spot columns or the "spot pitch" determines the number of lens rows in the array ($n_r$).

Figure 3A:
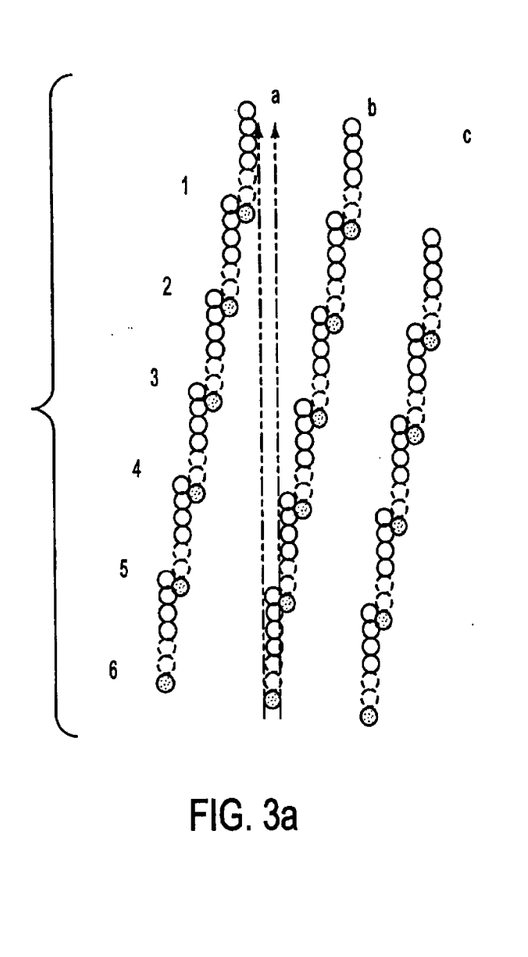
FIGS. 3a and 3b depict spot arrays according to embodiments of the present invention.
Figure 3B:
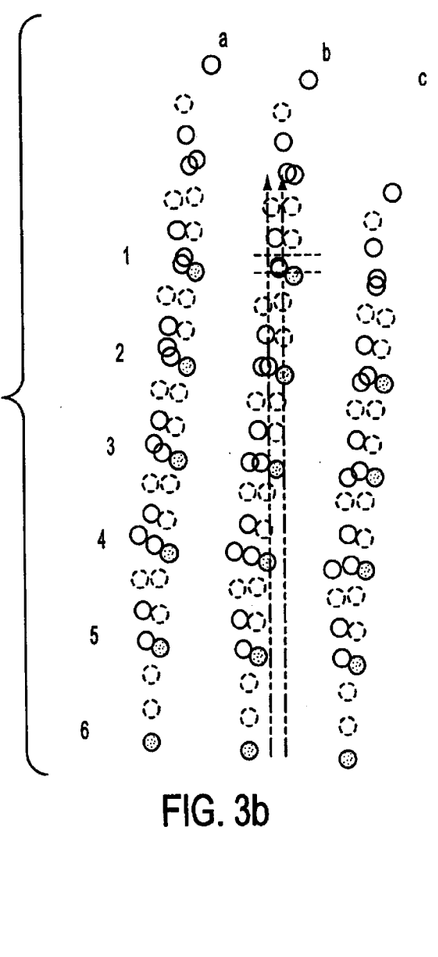

In an alternative embodiment of the present invention, a larger number of rows ($n_r$) are used, and the e-beam array is tilted such that the x-axis separation between the paths of spots in consecutive rows is a fraction (f) of the pixel-size ($p_x/f$). The substrate velocity is chosen such that it transverses a distance in the y-axis a factor f larger than a single pixel ($p_y/f$) Referring now to FIG. 3a, wherein a simple scan pattern is shown, for a given pixel created by spot $b1_1$, the subscript stands for the writing period, the y neighbor on top is $b1_2$, and the x neighbor on the left is $b3_n$ where $n=s/p_y$ (to create a rectangular array, the value of $s/p_y$ needs to be an integer). In FIG. 3b, however, an interlace scanning pattern is created (it shows f=2 for simplicity). In this case, $b1_1$ and $b1_2$ will be separated by a distance of $2p_y$, where the adjacent pixel to $b1_1$ will be $b2_n$ and $n=s/2p_y$. $b1_2$ will be shifted relative to $b1_1$ in a diagonal with a slant of 1/f. Therefore, for a large f the separation is mainly in the y direction. The result is a continuous coverage of the substrate achieved by an interleaving of f periodic structures offset in both axes.

An advantage of the interleaving of this embodiment of the present invention is a larger number of individual spots in a given FOV. Therefore for an identical pixel-rate requirement the array read rate ("frame-rate") can be lower since there are more elements in the array. When practicing this embodiment, close tolerances on the linearity of the motion of the mechanical stage and on the inter-spot spacing are necessary.

To obtain good results when practicing the spot array concept of the present invention, close tolerances on the linearity of the electron optics is important. The spots must be located on an exactly rectilinear grid with very exact distances between the spots. For example, if we have a grid 1000 rows deep, the thousandth row spot of column n must pass accurately near the location which was viewed by the first row's spot of column n-1. Assuming a desired accuracy of $\frac{1}{10}^{th}$ of a pixel, this implies linearity of one tenth of a pixel over the length of the FOV. Where the e-beam pitch is equal to 100 pixels, the linearity requirement is therefore $1:10^6$ (1000 rows*100 pixels pitch/0.1 pixel tolerance=$10^6$). This requirement for extreme accuracy is problematic if mechanical vibrations are present.

In a further embodiment of the present invention, this severe linearity requirement is removed by creating a small overlap between the coverage areas of the spots in consecutive columns, thereby reducing the deleterious effects of mechanical vibration on the system. This is achieved by providing additional rows of spots; e.g., adding rows "7" and "8" in the spot array of FIG. 2. Furthermore, in most automated inspection systems, such as Applied Materials' WF-736, the image comparison is done between two locations along the substrate scanning direction. The additional rows of pixels of this embodiment enable pixels generated by individual columns to be compared to pixels generated by the same column. Moreover, image processing algorithms typically require operations on a given pixel's neighbor. The overlap between columns (i.e., the additional rows of pixels) is preferably sufficient to provide "spare" pixels (typically 1 to 5 pixels) to ensure that neighboring pixels used for purposes of an algorithm are all from the same column. In this way, spot d6 does not have to be compared with a remote spot such as c1. This embodiment essentially makes the spots of each column into an individual data-path. It is also compatible with the use of a modularized image processing approach; for example, each column feeding into a separate image processing module. Such a modularized approach simplifies and speeds processing.

In this embodiment of the present invention, the linearity requirement is reduced to the distance between rows of an individual column which pass in the vicinity of each other. In the non-interlaced basic approach this distance is one spot pitch. For the case described above this is a linearity requirement of 1:1000 (100 pixels pitch/0.1 pixel tolerance). If interlacing is used (see FIG. 3b) the linearity requirement is multiplied by the interlace factor and thus becomes 1:10,000 for an interlace factor of 10.

In yet another embodiment of the present invention, electrons emitted from the spots formed on the substrate are collected from several directions simultaneously. This multi-perspective imaging technique enables defect detection and classification to be conducted with greater accuracy, since certain types of defects emit electrons (e.g., backscattered and/or secondary electrons) in characteristic known directions. Thus, the presence or absence of emissions of a particular type of electron at a particular angle in relation to the substrate can be used to determine the presence of a particular type of defect.

Figure 4:
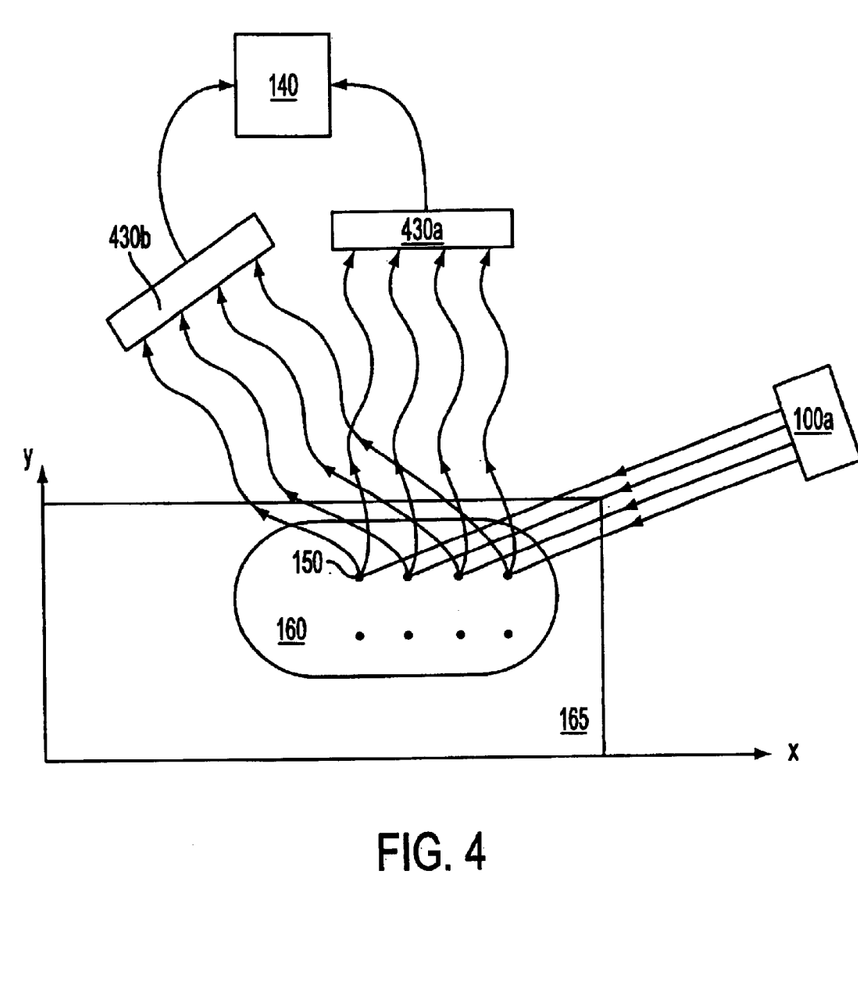
FIG. 4 schematically illustrates an imaging system in accordance with an embodiment of the present invention utilizing multiple detectors.

The multi-perspective imaging of this embodiment of the present invention can be achieved by placing several detectors 430a, 430b at different angles with relation to substrate 160, as depicted in FIG. 4. Any conventional detector systems can be employed that are capable of imaging the entire field of view of substrate 160 with the resolution of the separation of spots 150. Thus, a portion of the signals (i.e., emitted electrons) resulting from the interaction of spots 150 with the surface of substrate 160 emitted at a first angle are collected by detector 430a, and a portion of the signals resulting from the interaction of spots 150 with the surface of substrate 160 emitted at a second angle are collected by detector 430b.

Figure 5:
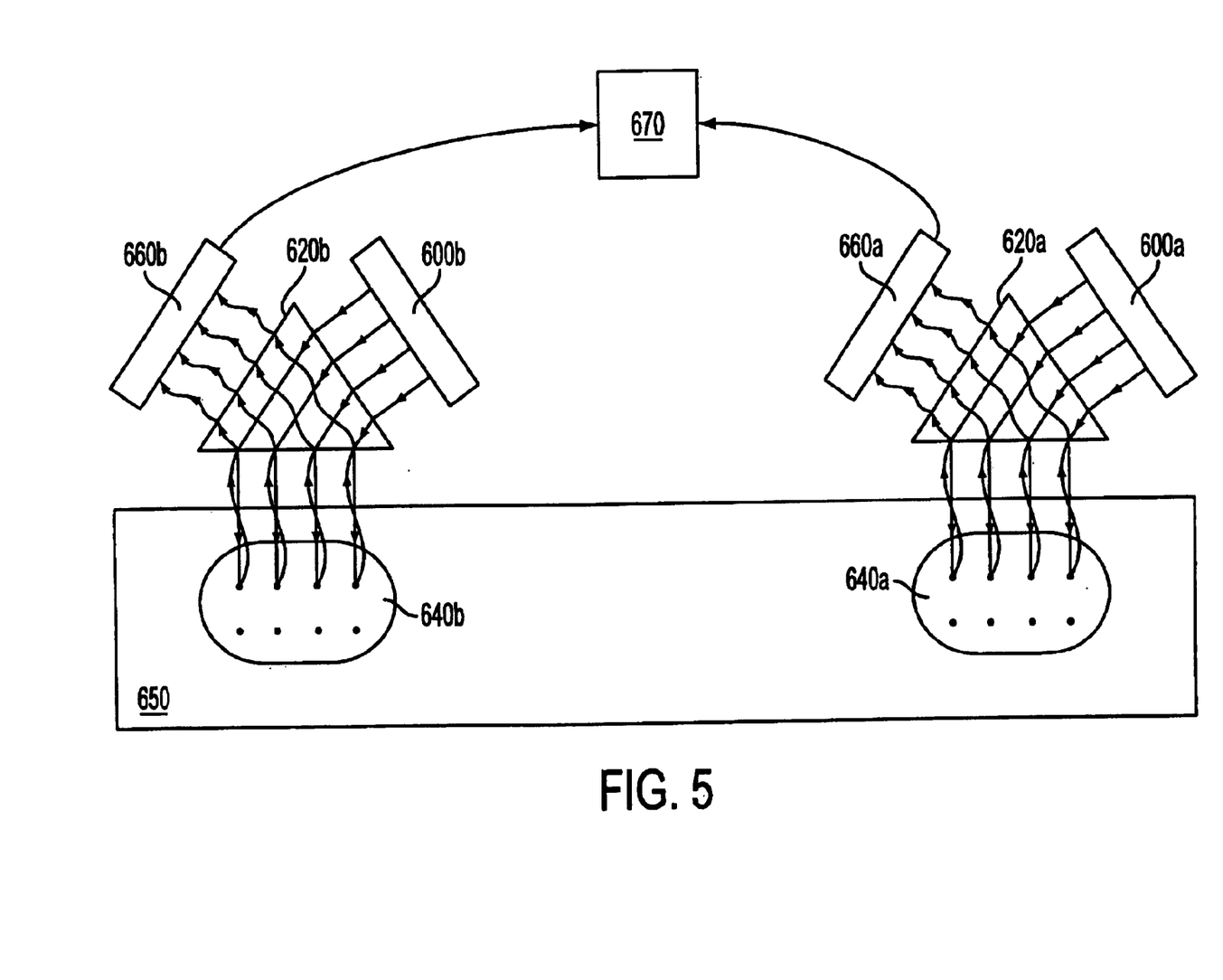
FIG. 5 schematically illustrates an imaging system in accordance with an embodiment of the present invention wherein two substrates are imaged simultaneously.

In a further embodiment of the present invention illustrated in FIG. 5, two corresponding substrates 640a, 640b, such as two identical dies from the same wafer, are placed on a movable stage 650, and one die is used as a reference for inspection of the other die. Electron sources 600a, 600b, which can be any one of the electron sources described above including conventional mini-columns or micro-columns, provide e-beams that impinge upon substrates 640a, 640b, as through beam splitters 620a, 620b as necessary, to irradiate identical arrays of spots on substrates 640a and 640b.

Signals from substrates 640a and 640b are collected by detector arrays 660a, 660b, and the resulting images compared by processor 670 to determine if defects exist on one of the substrates 640a, 640b. For example, the gray levels of corresponding pixels of the two images are compared, and if they differ by more than a predetermined threshold amount, processor 670 determines that a defect exists at that pixel location. As in previous embodiments of the present invention, movable stage 650 moves such that substantially the entire surface of each substrate 640a, 640b is irradiated and imaged. However, an advantage of this embodiment of the present invention is that since both substrates 640a, 640b undergo the same vibrations of stage 650, the unwanted effects of that vibration are not relevant, and do not need to be compensated for, as they do in the other embodiments described herein.

The following examples illustrate the calculation of various parameters relevant to the practice of the present invention:

Definitions:
FOV—Field-of-view in microns on substrate (assume square)
D—Pitch between spots on substrate in microns
p—Pixel size on substrate in microns
$n_y$ and $n_x$—number of rows and columns in array respectively
N—total number of spots in array
DR—Data-rate requirement (pixels/second/array)
FR—Frame-rate requirement (array-read/second)
V—stage velocity in y direction in microns/sec Since $FOV=D*n_x$, $n_y=D/p$. Thus, the total number of spots N to be irradiated is calculated by:

$$N=n_x*n_y=(FOV/D)*(D/p)=FOV/p$$

For a given data-rate requirement (DR) the frame rate (FR) and hence stage velocity required are:

$$FR=DR/N=DR*p/FOV \text{ and } V=FR*p=DR*p^2/FOV$$

EXAMPLE 1

FOV=1 mm=1000 micron
DR=10 Giga-pix/sec=$10^{10}$ pix/sec
P=100 nm=0.1 micron
→N=1000/0.1=10,000=$10^4$=>a 100 by 100 array;
→FR=$10^{10}/10^4=10^6$=1 mega-frames/second
→V=$10^6*0.1$ micron=100 mm/sec For a given pixel size, increasing the FOV is key to obtaining a larger number of pixels in the array, and hence to reduced frame-rates and stage velocity requirements (when using interleaving as shown in FIG. 3b, the number of rows and hence array elements increases and the frame-rate goes down, but the stage velocity requirement remains unchanged). This is an issue when using electron beam imaging and an electron-imaging column to focus multiple electron beams.

EXAMPLE 2

If the pixel size is reduced to 10 nm and the FOV is increased to 10 mm, the total number of array spots is N=10,000/0.01=$10^6$. Keeping the frame-rate (FR) at $10^6$ frames/second, the data rate (DR) of the present invention becomes $10^{12}$ pixels/second or one Tera-pixels/second. The stage velocity (V) at this DR is 10 mm/sec. This system according to the present invention is three orders of magnitude faster than any prior art system. Of course, such a system requires conventional image acquisition and image processing systems capable of handling a high data-rate.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. An imager comprising:
   an electron beam generator for simultaneously irradiating an array of spots spaced apart from each other on a surface of an object to be imaged;
   a detector for collecting signals resulting from the interaction of the spots with the surface of the object to form an image of the irradiated portions of the object surface; and a movable stage for supporting the object and moving the object substantially linearly in a scanning direction that deviates from an axis of the spot array, such that as the object is moved a distance substantially equal to a length of the spot array in the scanning direction, the spots trace a substantially continuous path on the object surface in a mechanical cross-scan direction, and a predetermined portion of the surface of the object can be irradiated and imaged.

2. The imager of claim 1, comprising a compensator for compensating for mechanical inaccuracies in the movable stage.

3. The imager of claim 2, wherein the compensator comprises a servo for moving the spot array to compensate for the mechanical inaccuracies.

4. The imager of claim 2, wherein the compensator is selected from the group consisting of a movable mirror, an electro-optic element and an acousto-optic element for varying an angle of incidence of the light source onto the surface of the object for compensating for the mechanical inaccuracies in the movable stage.

5. The imager of claim 1, wherein the electron beam generator comprises an electron source for directly irradiating the spots on the object surface.

6. The imager of claim 5, wherein the electron beam generator comprises an electron imaging column having a plurality of cathodes.

7. The imager of claim 5, wherein the electron beam generator comprises a pin-hole array for blocking an area flux of electrons from the electron source.

8. The imager of claim 5, wherein the electron source is for producing a collimated electron beam, and the electron beam generator comprises an electron blocking mask for converting the collimated electron beam into the spot array.

9. The imager of claim 1, wherein the electron beam generator comprises a projection apparatus including an electron source and an electron-optical system for generating the electron spot array from electrons furnished by the electron source.

10. The imager of claim 9, wherein the projection apparatus comprises a photocathode and an optical spot array generator.

11. The imager of claim 10, wherein the optical spot array generator comprises a micro-lens array.

12. The imager of claim 1, wherein the detector detects one of secondary and backscattered electrons from the object surface.

13. The imager of claim 12, comprising an electron optical system for generating one of a backscattered electron image and a secondary electron image from the electrons detected by the detector.

14. The imager of claim 13, wherein the electron optical system comprises an MCP and a detector array.

15. The imager of claim 14, wherein the detector array comprises a CCD.

16. The imager of claim 13, wherein the electron optical system comprises a scintillator, an image intensifier, and a CCD.

17. The imager of claim 9, wherein the projection apparatus comprises a beam-splitter.

18. The imager of claim 8, wherein the electron blocking mask comprises:
a plurality of metallic lens array membranes, each lens array membrane having an array of pinholes corresponding to the spots of the spot array, the lens array membranes being substantially parallel to each other and disposed between the electron source and the substrate such that their pinholes are concentric; and a voltage source connected to each lens array membrane for supplying a different voltage to each lens array membrane.

19. The imager of claim 18, wherein each lens array membrane has pinholes of a different diameter than the pinholes of the other lens array membranes.

20. The imager of claim 18, further comprising an aperture membrane comprising an array of pinholes corresponding to the pinholes of the lens array membranes, the aperture membrane disposed between the electron source and the plurality of lens array membranes.

21. The imager of claim 1, wherein the movable stage is for moving the object such that the spots overlap as they trace the continuous path on the object surface.

22. The imager of claim 21, wherein the movable stage is for moving the object such that the spots are interleaved as they trace the continuous path on the object surface.

23. The imager of claim 21, wherein the spot array comprises a plurality of rows and columns of spots, and the electron beam generator is for irradiating a predetermined number of rows of spots such that the spots of two adjacent ones of the columns overlap as they trace the continuous path on the object surface.

24. The imager of claim 1, wherein the electron beam generator is for irradiating a first path between the electron beam generator and the surface of the object, and the detector is for collecting the signals from the surface of the object along a second path different from the first path.

25. The imager of claim 23, wherein the electron beam generator is for irradiating additional rows of spots, such that a total number of rows of spots is greater than the predetermined number of rows of spots, and the two adjacent ones of the columns overlap.

26. The imager of claim 25, wherein the electron beam generator is for irradiating a sufficient number of the additional rows of spots such that neighboring pixels used for an image processing algorithm are all from one of the columns.

27. An inspection system comprising:
a first electron beam generator for irradiating a first array of spots spaced apart from each other on a surface of a first object to be imaged;
a second electron beam generator for irradiating a second array of spots spaced apart from each other on a surface of a second object to be imaged, wherein the first and second spot arrays are substantially identical, and the surfaces of the first and second objects correspond to each other;
a first detector array for collecting signals resulting from the interaction of the spots with the surface of the first object to form an image of the irradiated portions of the first object surface;
a second detector array for collecting signals resulting from the interaction of the spots with the surface of the second object to form an image of the irradiated portions of the second object surface;
a movable stage for supporting the first and second objects and moving the objects such that substantially the entire surface of each object can be irradiated and imaged; and
a processor for comparing the images of the first and second objects.

28. The inspection system of claim 27, wherein the processor is configured to determine whether a defect exists in the surface of the second object based on the comparison of the images of the first and second objects.

29. The inspection system of claim 28, wherein the processor is configured to determine that a defect exists in the surface of the second object when a value of a parameter of the image of the second objects surface differs from a value of the parameter of the image of the first object surface by more than a predetermined threshold amount.

30. The imager of claim 27, further comprising a compensator for compensating for mechanical inaccuracies in the movable stage.

31. A method comprising the steps of:
directing electrons to simultaneously irradiate an array of spots spaced apart from each other on a surface of an object to be imaged;
collecting signals resulting from the interaction of the spots with the surface of the object to form an image of the irradiated portions of the object surface; and
moving the object on a movable stage while the irradiating and collecting steps are being performed, substantially linearly in a scanning direction that deviates from an axis of the spot array, such that as the object is moved a distance substantially equal to a length of the spot array in the scanning direction, the spots trace a substantially continuous path on the object surface in a mechanical cross-scan direction, and a predetermined portion of the surface of the object can be irradiated and imaged.

32. The method of claim 31, comprising moving the object such that the spots overlap as the trace the continuous path on the object surface.

33. The method of claim 32, comprising moving the object such that the spots are interleaved as they trace the continuous path on the object surface.

34. The method of claim 32, wherein the spot array comprises a plurality of rows and columns of spots, comprising irradiating a predetermined number of rows of spots such that the spots of two adjacent ones of the columns overlap as they trace the continuous path on the object surface.

35. The method of claim 34, wherein the plurality of rows and columns of spots corresponds to an area of a portion of the surface of the object, the method comprising irradiating additional rows of spots, such that a total number of rows of spots is greater than the predetermined number of rows of spots, and the two adjacent ones of the columns overlap.

36. A method comprising:
directing electrons to simultaneously irradiate a first array of spots spaced apart from each other on a surface of a first object to be imaged;
directing electrons to simultaneously irradiate a second array of spots spaced apart from each other on a surface of a second object to be imaged, wherein the first and second spot arrays are substantially identical, and the surfaces of the first and second objects correspond to each other;
collecting signals resulting from the interaction of the spots with the surface of the first object to form an image of the irradiated portions of the first object surface;
collecting signals resulting from the interaction of the spots with the surface of the second object to form an image of the irradiated portions of the second object surface;
moving the first and second objects on a movable stage such that a predetermined portion of the surface of each object can be irradiated and imaged; and
comparing the images of the first and second objects.

37. The method of claim 36, comprising determining whether a defect exists in the surface of the second object based on the comparison of the images of the first and second objects.

38. The method of claim 37, comprising determining that a defect exists in the surface of the second object when a value of a parameter of the image of the second object surface differs from a value of the parameter of the image of the first object surface by more than a predetermined threshold amount.

39. The method of claim 36, wherein the first and second objects are subject to substantially identical mechanical vibrations during the moving step.

40. The method of claim 36, comprising compensating for mechanical inaccuracies in the moving stage.

41. The imager of claim 1, wherein the movable stage is for moving the object from a first position to a second position in the scanning direction such that the spots on the object surface at the second position are offset from an axis of the scanning direction and from the mechanical cross-scan direction relative to the first position.

42. The imager of claim 1, wherein a first portion of the signals resulting from the interaction of the spots with the surface of the object are emitted from the surface at a first angle and collected by the detector, and a second portion of the signals are emitted from the surface at a second angle different from the first angle, the imager further comprising a second detector for collecting the second portion of the signals.

* * * * *